Figure 1:
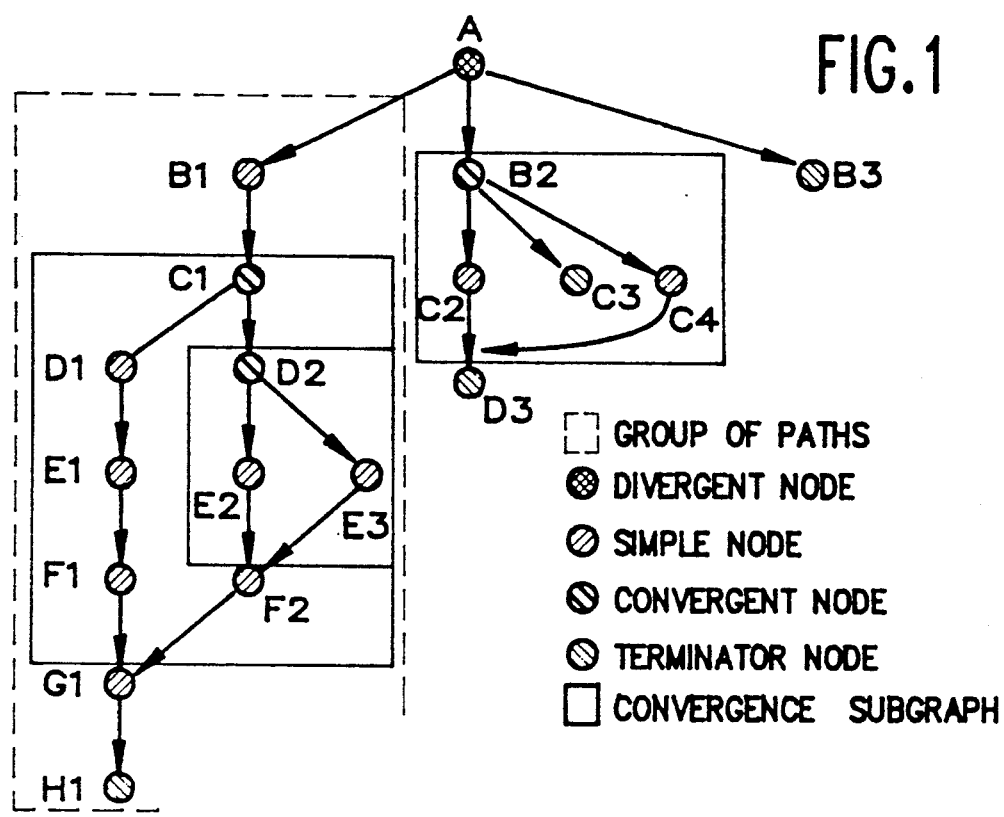

United States Patent [19]

Camacho et al.

[11] Patent Number: 5,278,951
[45] Date of Patent: Jan. 11, 1994

[54] DECOMPILATION PROCESS FOR PRODUCING GRAPHS BY MEANS OF A COMPUTER

[75] Inventors: Jean Camacho, Paris; Anne Rouger, Issy-les-Mlx, both of France

[73] Assignee: France Telecom Etablissement Autonome De Droit Public, France

[21] Appl. No.: 871,330

[22] Filed: Apr. 21, 1992

[30] Foreign Application Priority Data

Apr. 22, 1991 [FR] France .................. 91 04922

[51] Int. Cl.$^5$ ........................... G06F 15/62
[52] U.S. Cl. .................. 395/140; 395/155; 395/161
[58] Field of Search ... 395/140–1, 143, 155, 160, 161

[56] References Cited

U.S. PATENT DOCUMENTS 4,710,763 12/1987 Franke et al. .................. 395/160 X
4,953,106 8/1990 Gansner et al. .................. 395/160

OTHER PUBLICATIONS

IEEE Software, vol. 17, No. 4, Jul. 1990, Los Alamitos U.S., pp. 21–28; S. Moen: "Drawing Dynamic Trees".
SDL '87: State of the Art and Future Trends, Apr. 3, 1987, Elsevier, Amsterdam, Netherlands, pp. 117–126; Jin P. Hong et al.: "SDL–Oriented Graphical Environment".

Primary Examiner—Heather R. Herndon
Assistant Examiner—Almis Jankus
Attorney, Agent, or Firm—Pearne, Gordon, McCoy & Granger

[57] ABSTRACT

The display of structured oriented graphs undergoing incremental modifications is locally updated by determining the area containing the modification and the affected areas surrounding the modification. The affected areas are shifted to accommodate the modification without the necessity of regenerating the entire display.

7 Claims, 13 Drawing Sheets

DECOMPILATION PROCESS FOR PRODUCING GRAPHS BY MEANS OF A COMPUTER

DESCRIPTION

The present invention relates to a decompilation process for producing graphs by means of a computer, particularly for the representation of a structured oriented graph.

So-called "oriented" languages are used in numerous fields and these are languages which have been developed for a particular application. This is e.g. the case with the description and specification language DSL, defined and standardized by CCITT. This language is used in the field of telecommunications and is tending to be increasingly used in any real time application. Such languages and in particular DSL make use of structured oriented graphs. A structured graph is a diagram formed from related elements.

When modifications of the diagram have to be introduced, use is made of processes carried out by the computer and on the basis of this are produced graphs for reorganizing the diagram. These processes are structural editing processes, which know the syntax of the representation kept in the memory in the form of an internal, tree-like representation, whose tops are syntactic structures.

The decompilation process performed by the decompilator effects the correspondence between the tree of the internal representation and the graphic representation of the diagram on the screen. The disadvantage of existing decompilators is that they completely redraw or redesign the diagram after each modification.

A first consequence is the resulting visual disturbance. Thus, conventional processes consist of erasing the entire drawing or design and then making the same reappear on the screen with the correction. However, this operation causes a "flash" effect, which is a visual disturbance and which would not occur if the diagram had been produced manually (or in the case where only the useful part had been redrawn or redesigned).

A second consequence is that the redrawing time obviously increases with the size of the diagram. This consequence prevents any editing of large diagrams and is very disadvantageous from the performance standpoint.

The present invention aims at obviating these disadvantages. The invention, as characterized in the claims, solves the problem consisting of proposing a decompilation process, which is incremental and which makes it possible to produce graphs by means of a computer resulting in a minimum of redrawing in just the same way as if the operator had an eraser and a pencil.

Therefore the process according to the invention has the sought visual comfort and leads to a considerable improvement of the response time.

The present invention more particularly relates to a decompilation process for producing graphs by means of a computer, which is characterized in that it consists of defining and storing in the memory elements used for the production of graphs in tree form constituted by nodes and branches.

The invention specifically relates to a decompilation process for producing graphs by means of a computer connected to a display screen, characterized in that it comprises the following stages:

defining and storing in a memory a data structure describing any graph at all stages of its creation in the form of a tree structure having a divergent node corresponding to the root of the tree connected to simple, convergent or terminator nodes, the nodes other than the terminator nodes being connected to other simple, convergent or terminator nodes, so that the different nodes form the basis for structures interleaved in one another;

drawing up a table of correspondence between the internal, tree-like representation described in the data structure and its external graphic representation on the screen, in which each element of the graph is marked relative to areas of the screen resulting from a matrix subdivision into rows and columns;

effectively producing the graph by carrying out successive insertion and/or destruction operations of elements defined in the data structure, said insertions and/or destructions taking place in the desired areas of the screen by successive operations of shifting graph elements located beyond the areas in which is located the element to be inserted or destroyed;

displaying the graph during its production and its modifications;

updating the internal description and the table of correspondence.

The invention is described in greater detail hereinafter relative to non-limitative embodiments and with reference to the attached drawings, wherein show:

FIG. 1—The tree-like diagram of a structured oriented graph.

Figure 2:
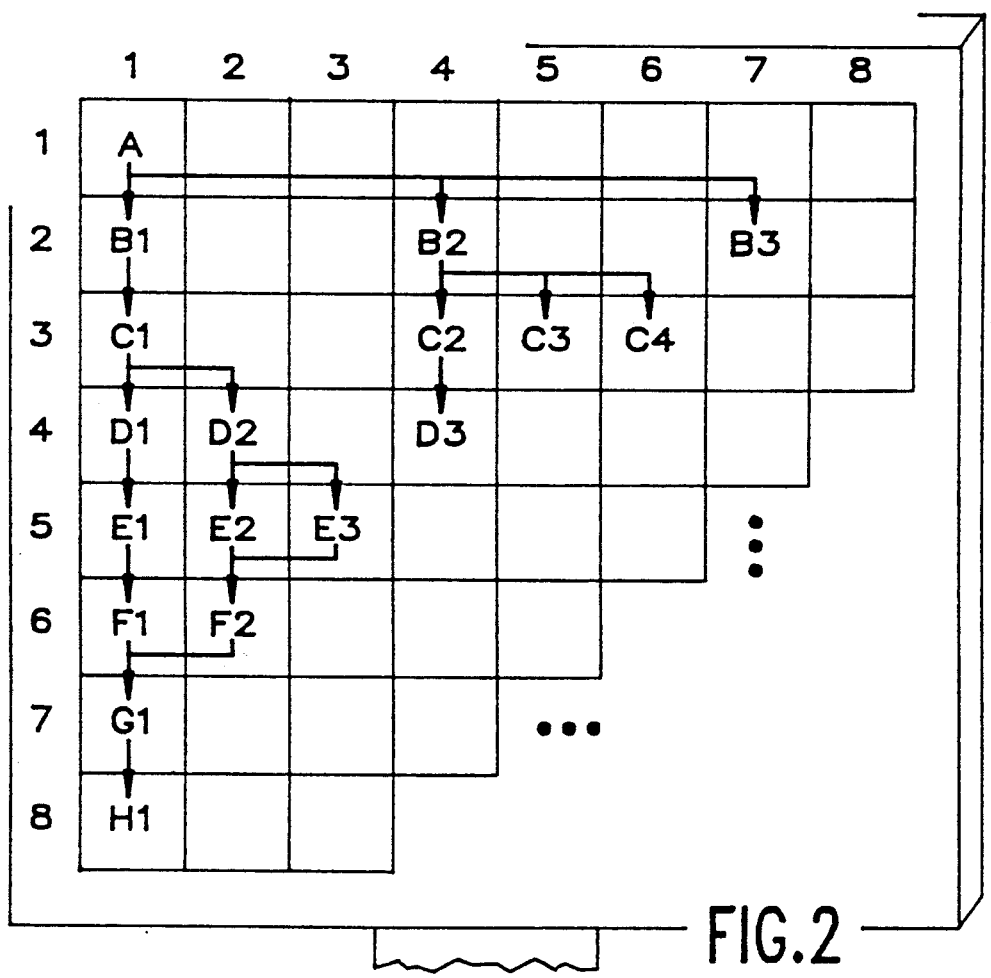

FIG. 2—The diagram of said graph on the screen.

Figure 3:
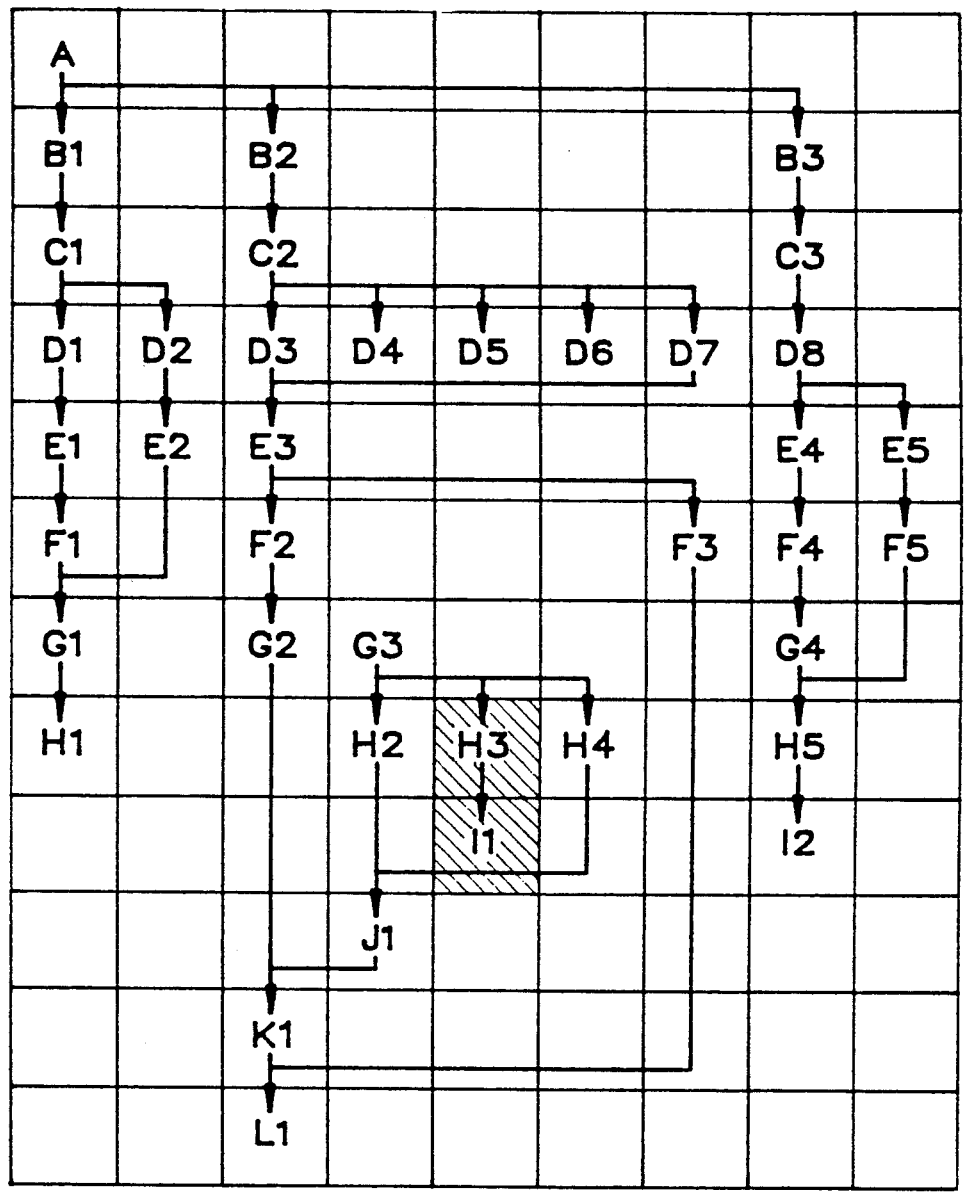
Figure 4:
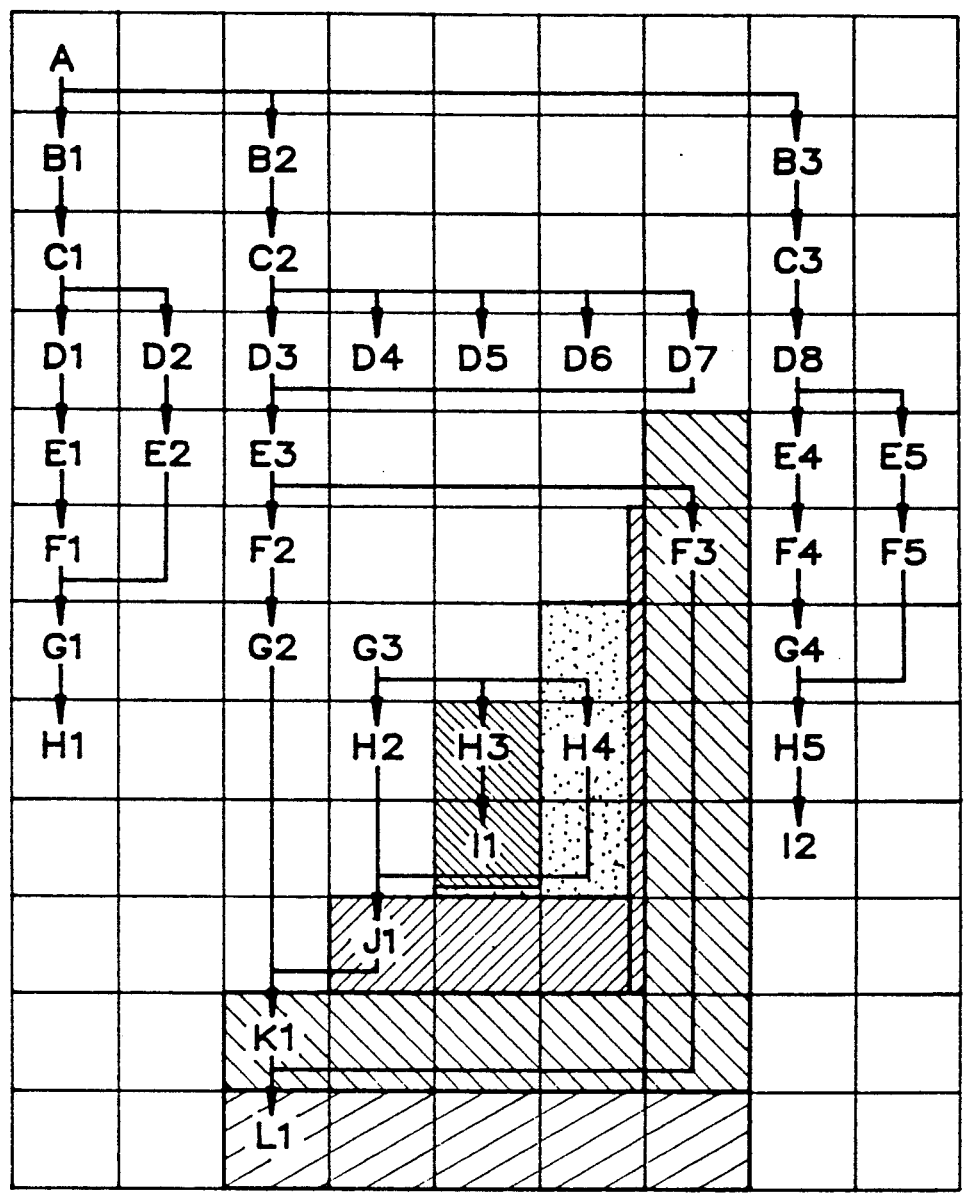
Figure 4:
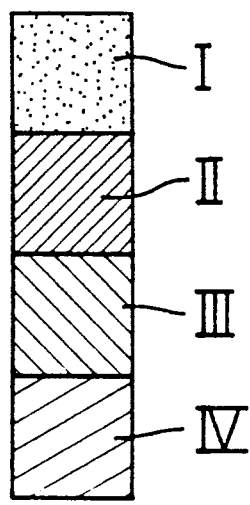
Figure 5:
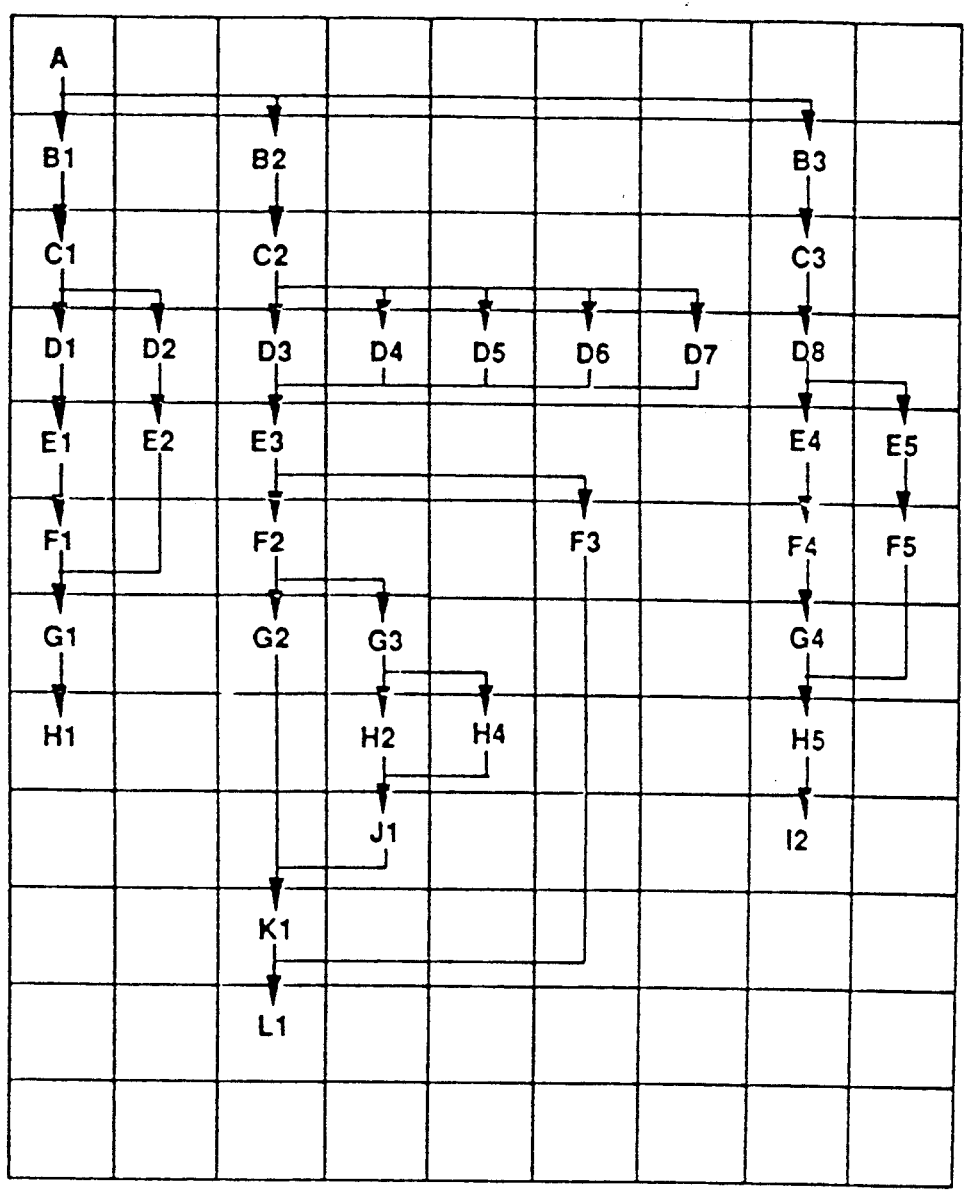

FIGS. 3, 4 and 5—Diagrams of a graph in the case of a branch destruction.

Figure 6:
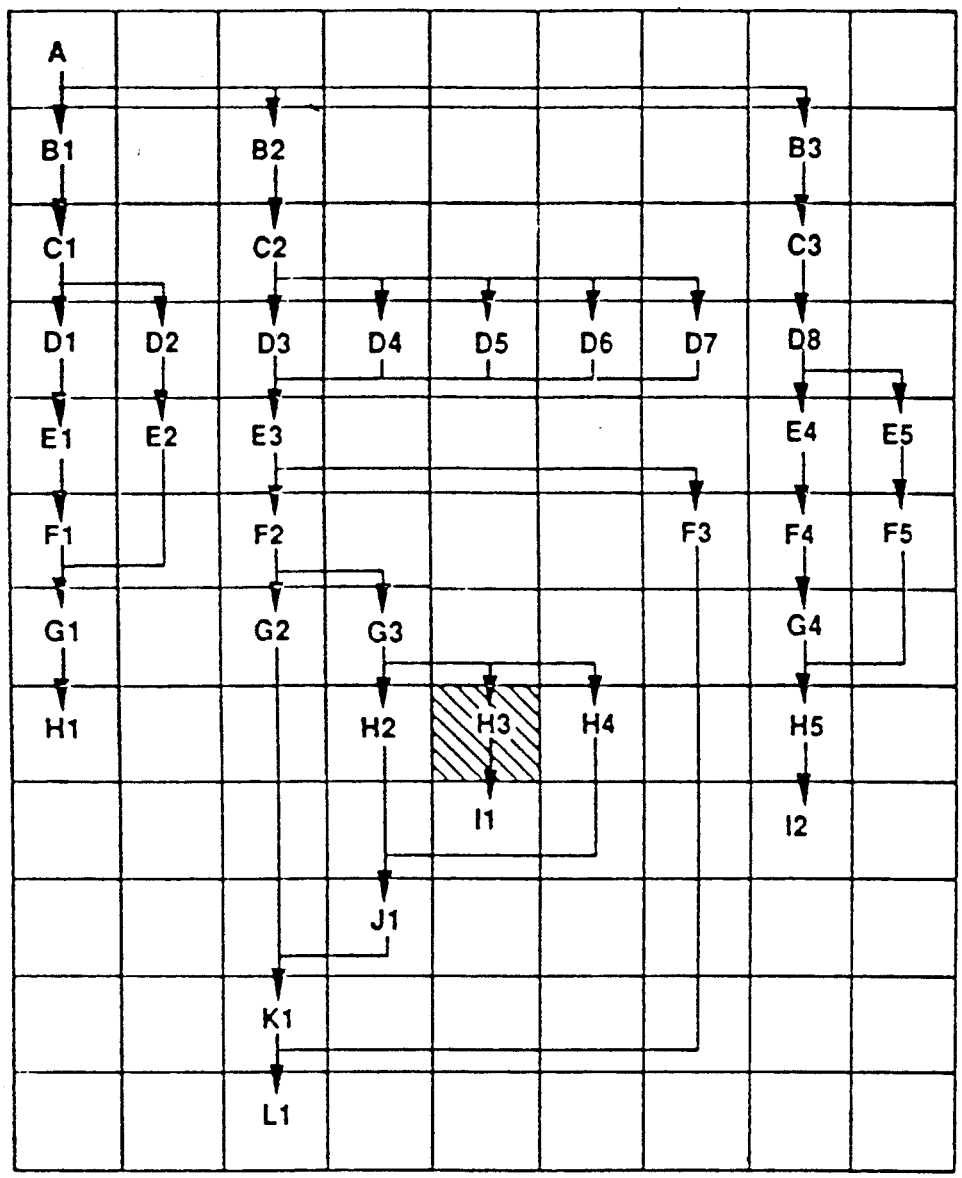
Figure 7:
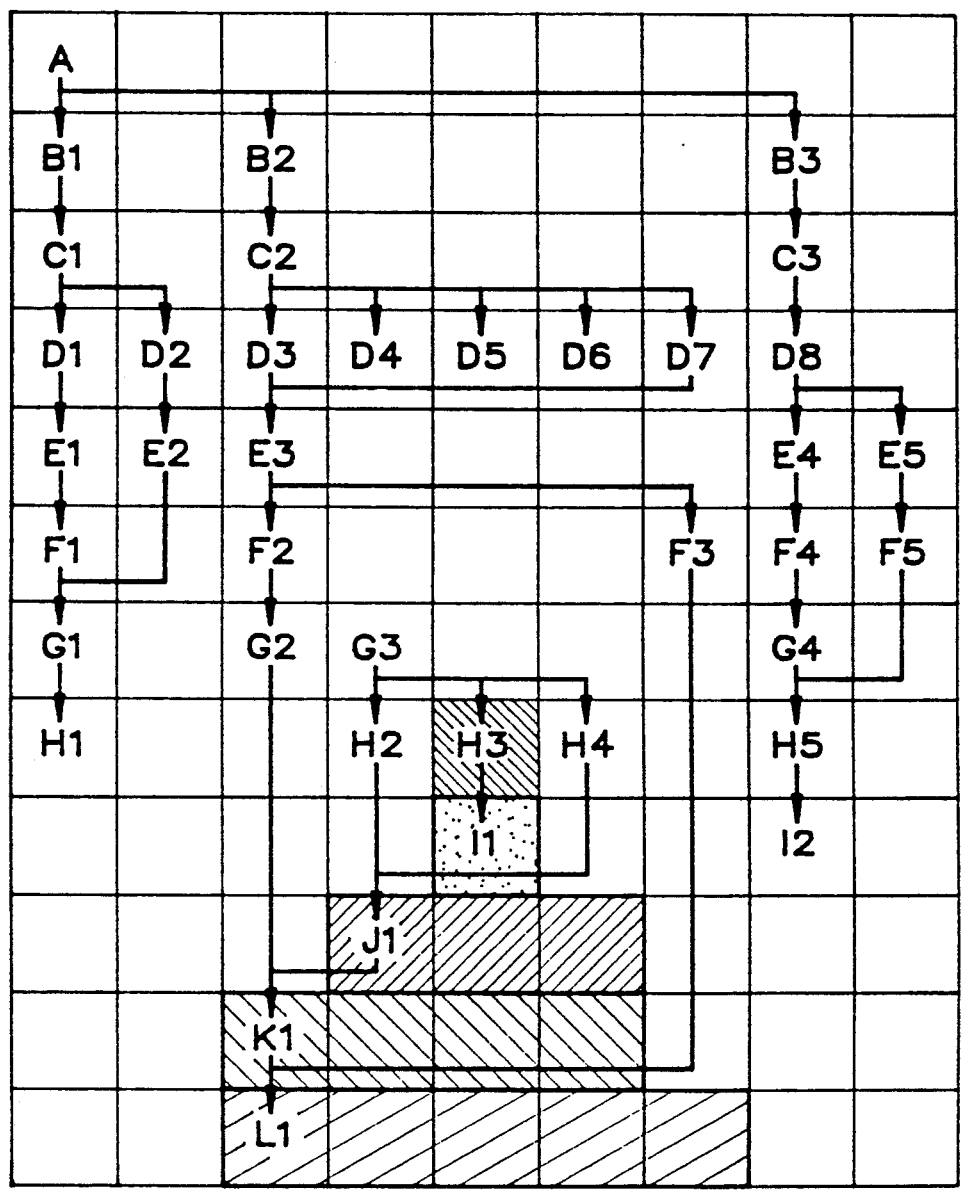
Figure 7:
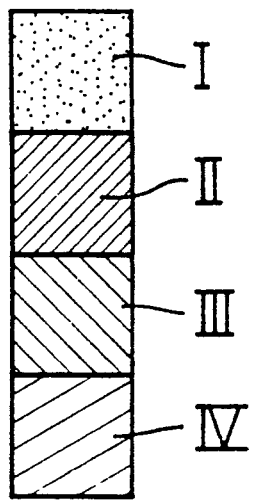
Figure 8:
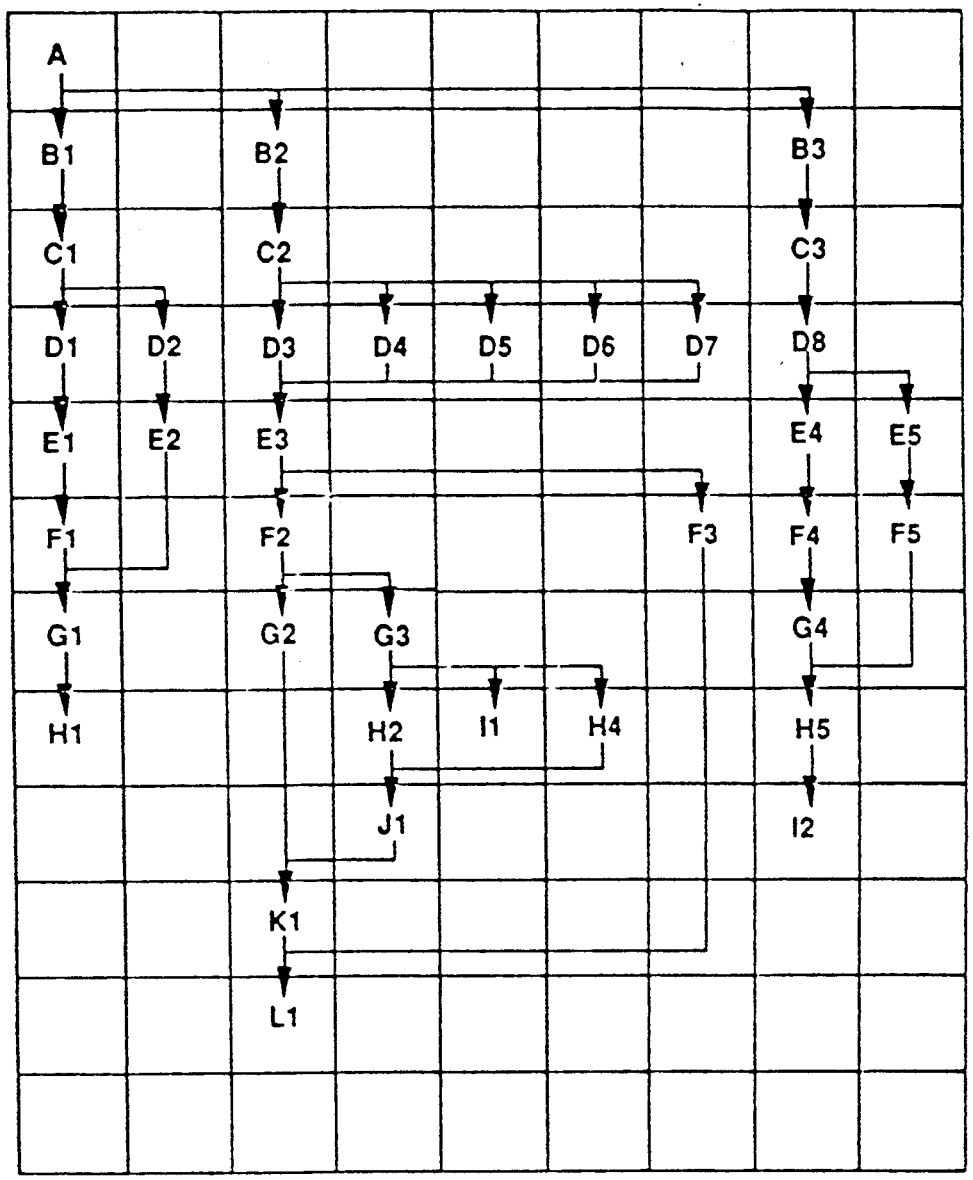

FIGS. 6, 7 and 8—Diagrams of a graph in the case of a node destruction.

Figure 9:
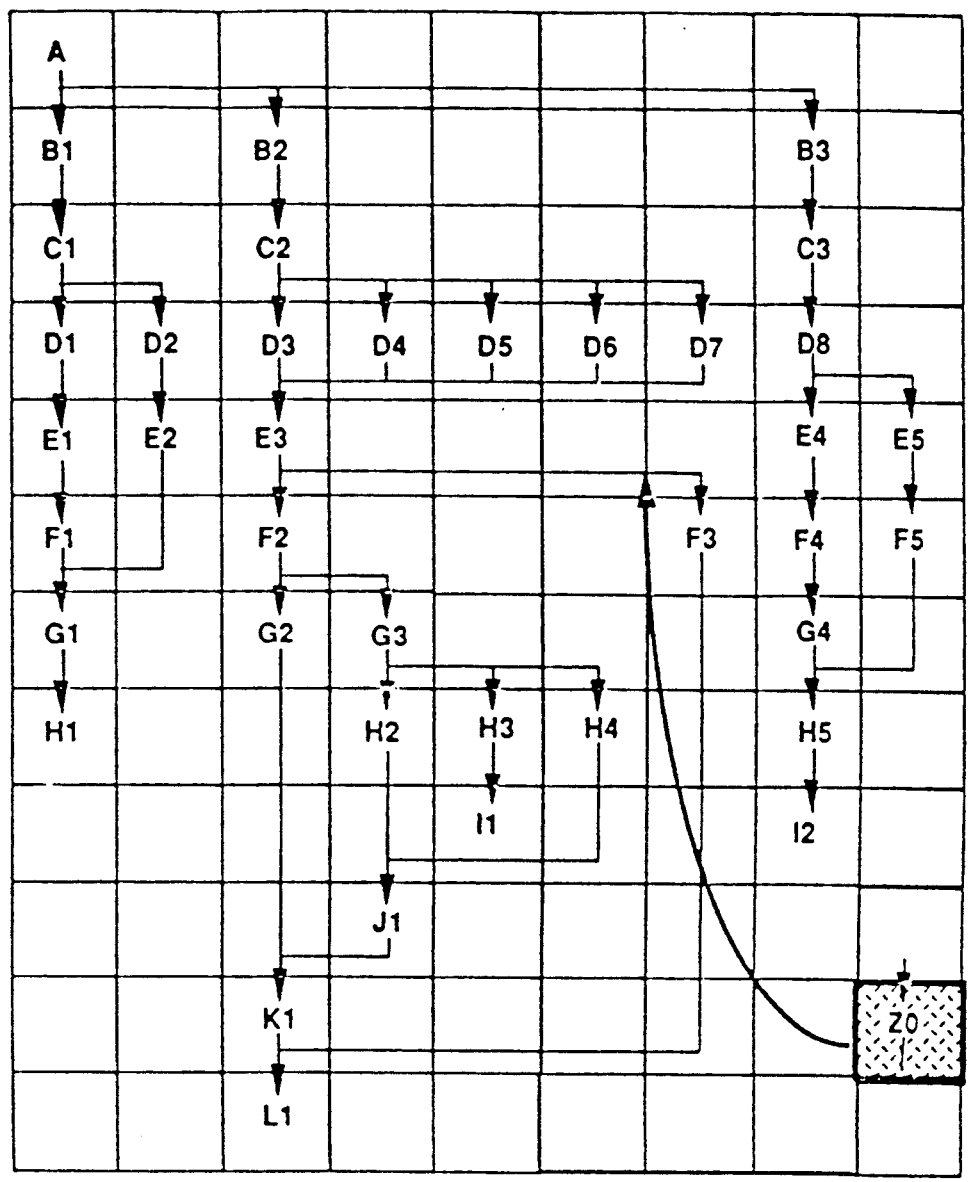
Figure 10:
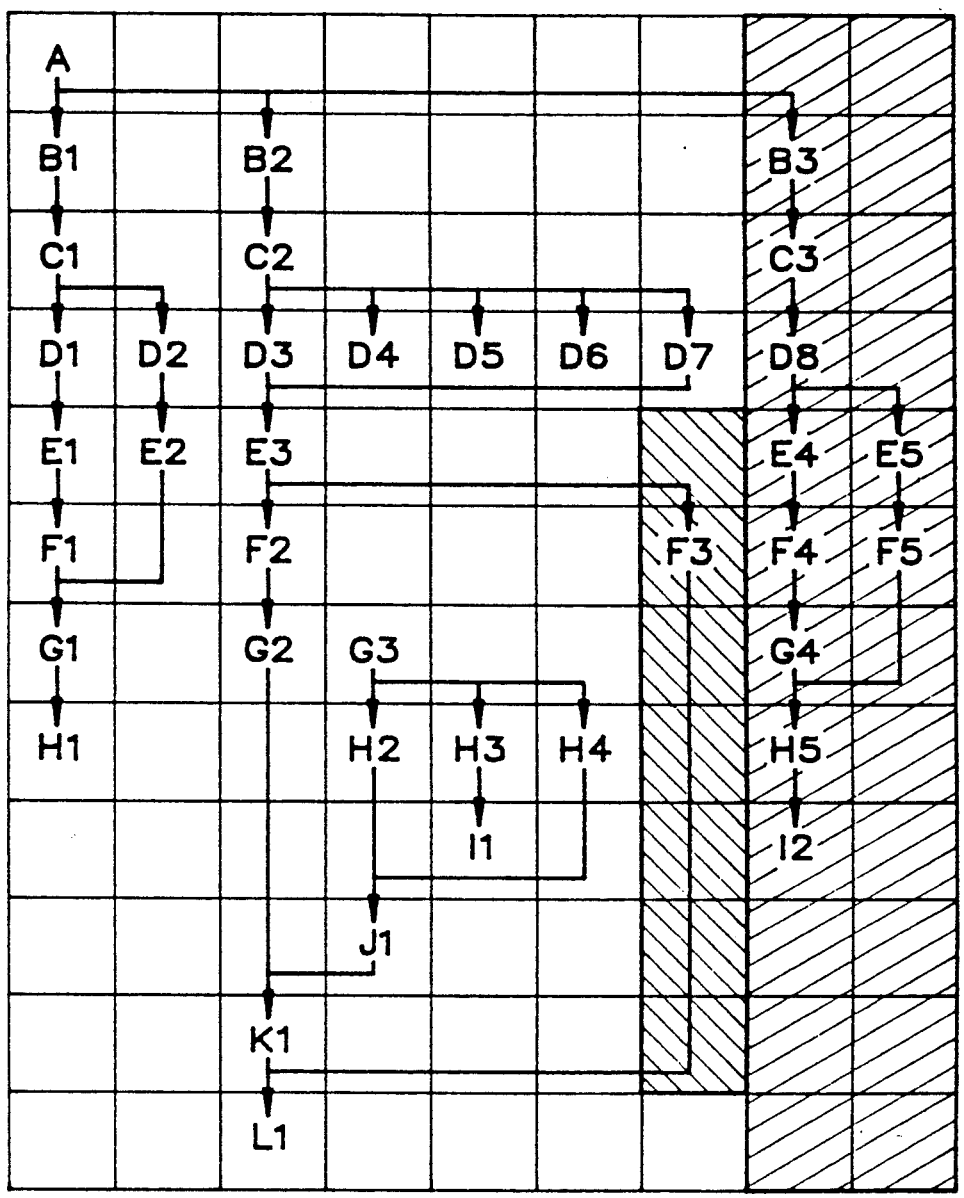
Figure 10:
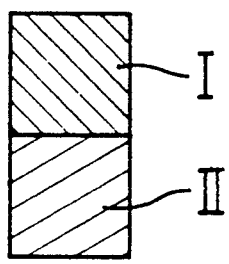
Figure 11:
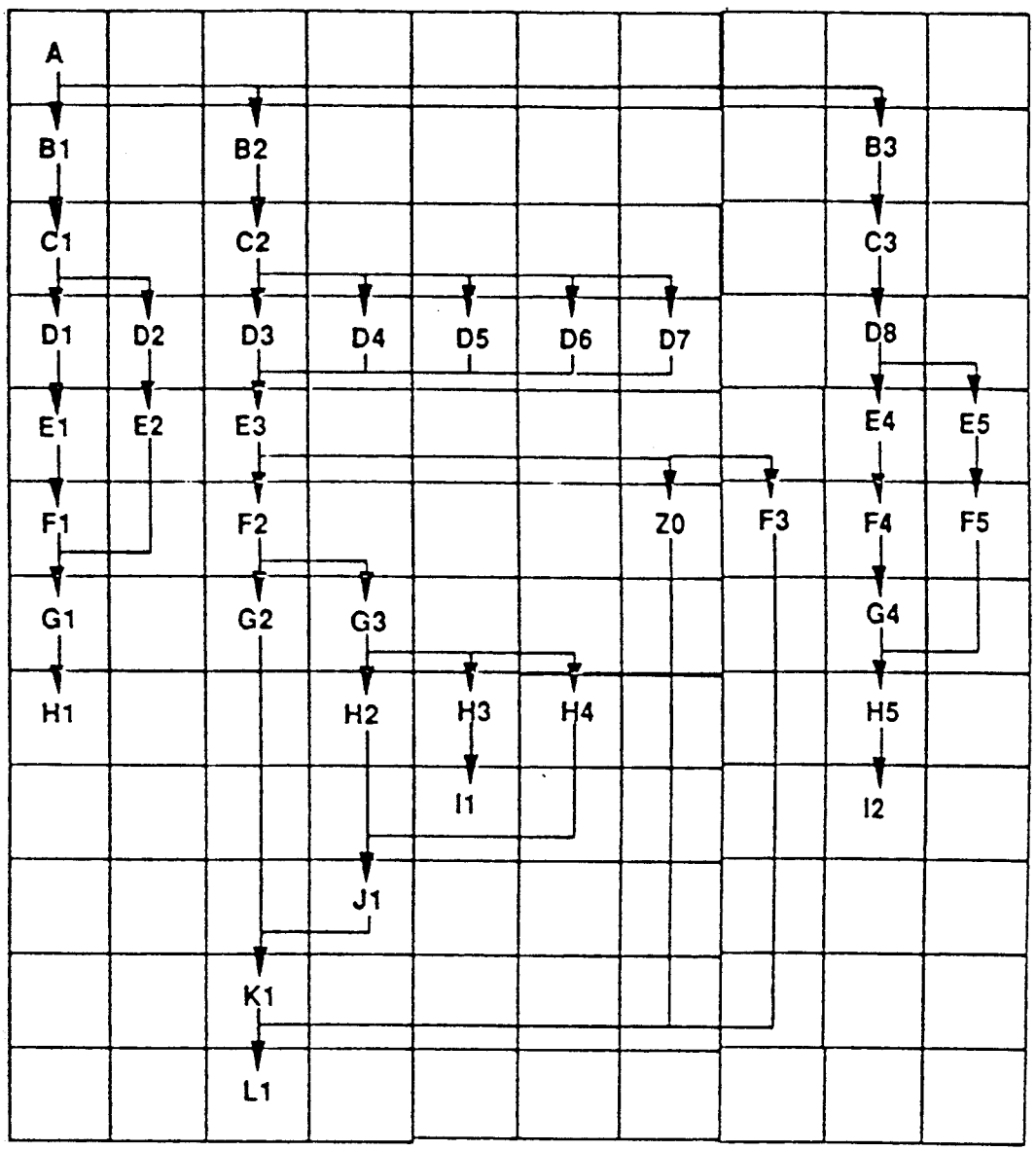

FIGS. 9, 10 and 11—Diagrams of a graph in the case of a branch insertion.

Figure 12:
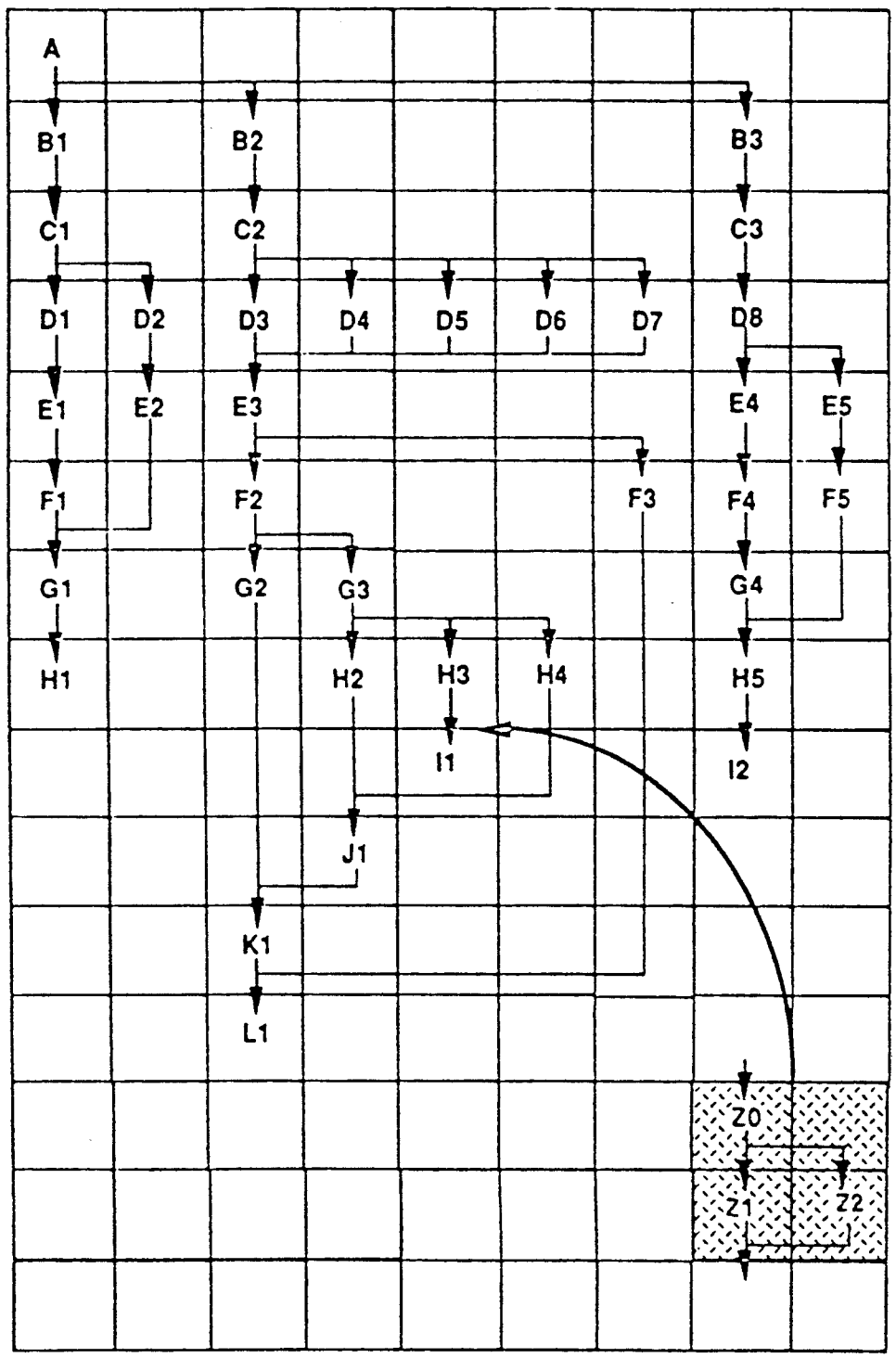
Figure 13:
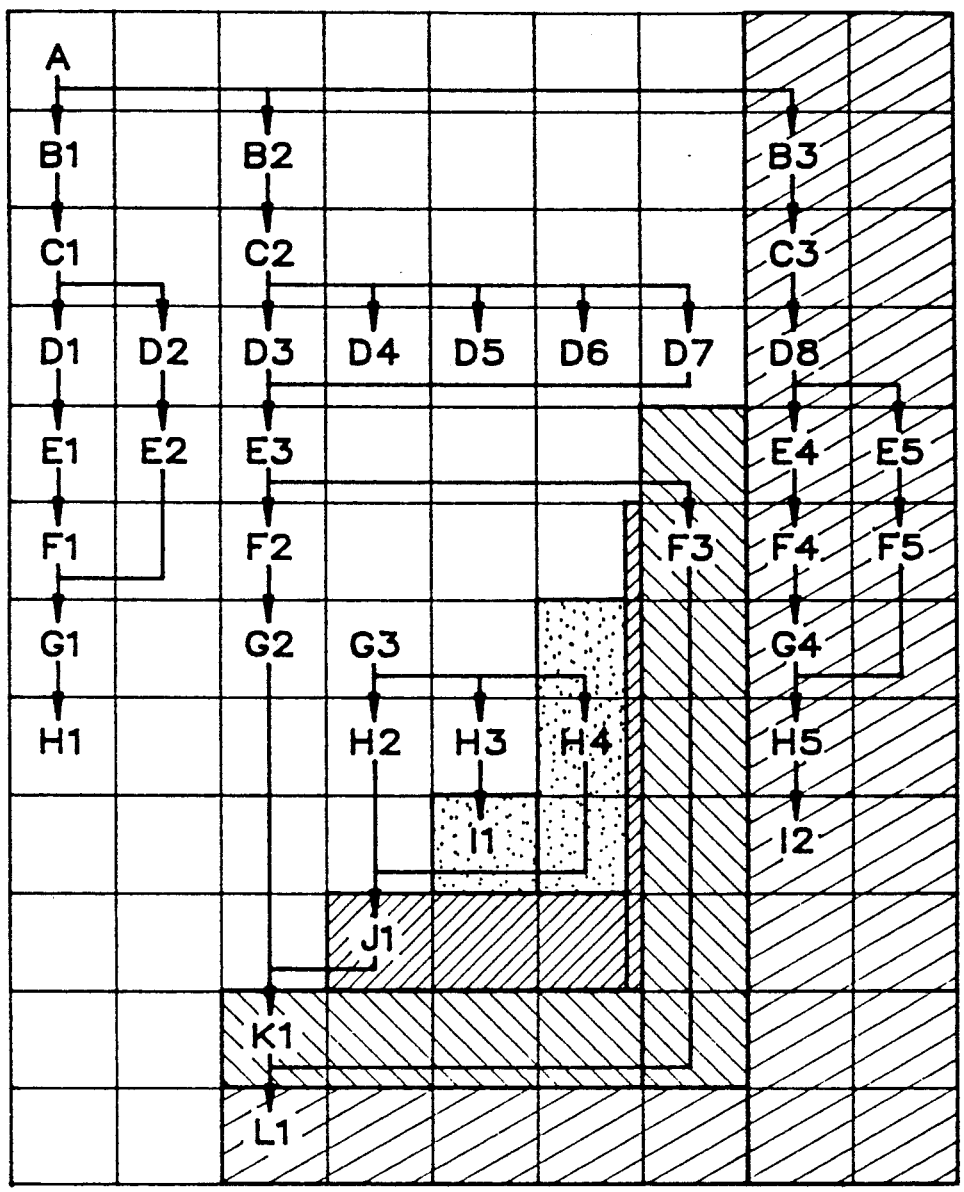
Figure 13:
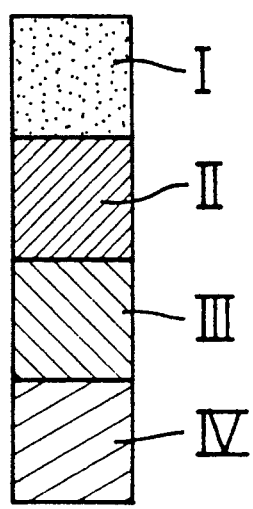
Figure 14:
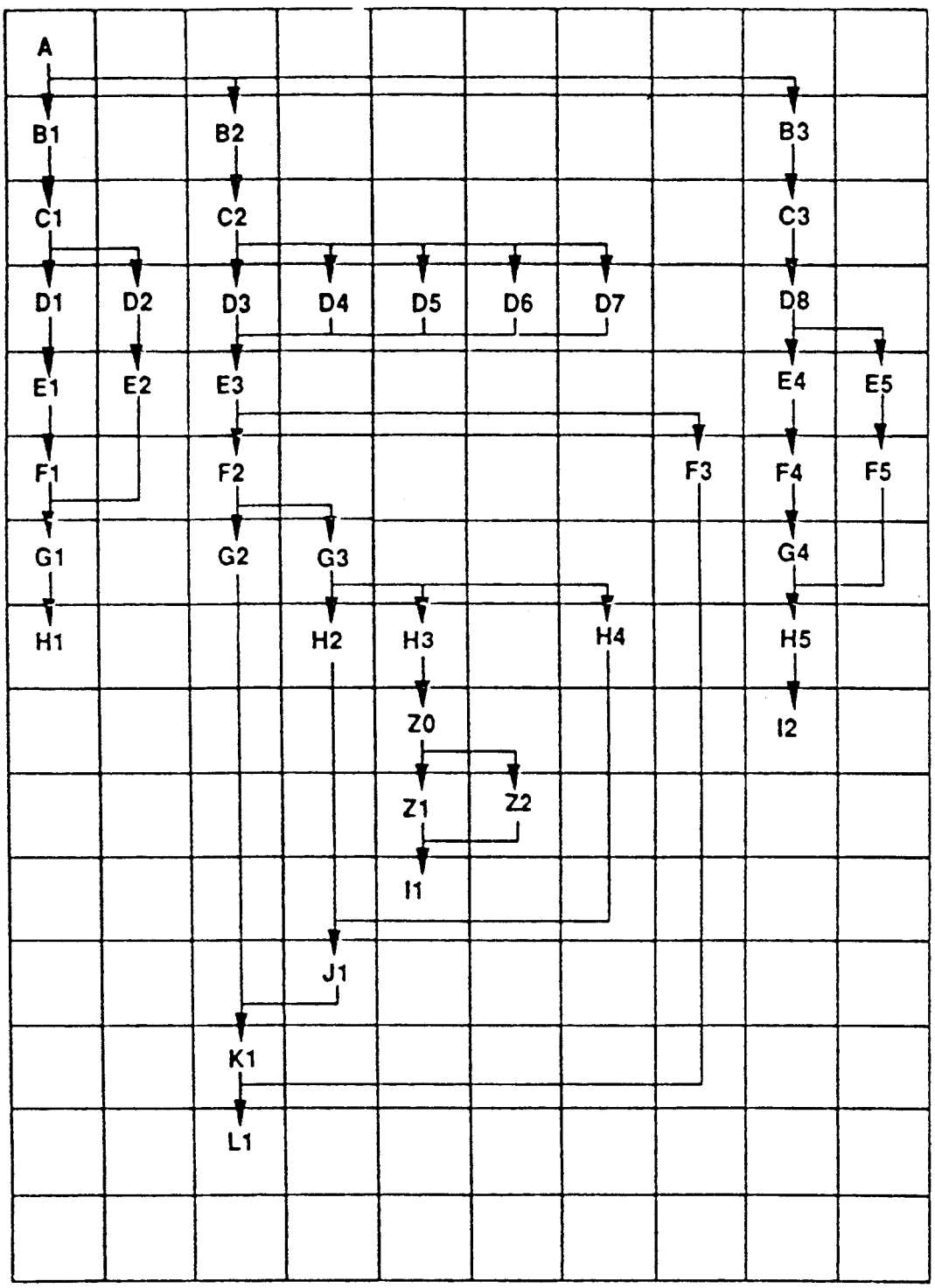

FIGS. 12, 13 and 14—Diagrams of a graph in the case of a node insertion.

A definition will firstly be given of what is meant by structured oriented graph. Reference can be made in this connection to the diagram of FIG. 1. It is a graph formed from four different node types called the simple (single) node, terminator node, convergent node and divergent node.

A simple node is a node having a single exiting arc, said node having one or more entering arcs (e.g. B1, D1, G1).

A terminator node is a node without an exiting arc, said node having one or more entering arcs (e.g. H1, D3, B3).

A divergent node is a node only having exiting arcs and such that there is no common node between the groups of paths produced (e.g. A). A group of paths consists of all the paths commencing with an exiting arc of a divergent node. For example, the group of paths commencing with the arc A→B1 is constituted by three paths:

(A, B1, C1, D1, E1, F1, G1, H1)
(A, B1, C1, D2, E2, F2, G1, H1)
(A, B1, C1, D2, E3, F2, G1, H1).

Hereinafter, a group of paths is referred to as a branch (notation A->B1).

A convergent node is a node having several exiting arcs and such that the paths produced either terminate by a terminator node or converge towards a single common node referred to as the convergence point.

A convergence point can be a simple node (e.g. G1), a terminator node (e.g. D3) or a convergent node.

A structured oriented graph has the following special features:

1) The single divergent node is the root (A). It represents the graph. Its destruction leads to the destruction of the graph.

2) A convergent node represents a so-called convergence subgraph structure, which corresponds to all the paths produced from the convergent node up to the predecessors of the convergence point.

The suppression of a convergent node leads to the destruction of the convergence subgraph. All that is left is the convergence point, which is connected to the predecessors of the convergent node destroyed. In addition, the convergent nodes have the following property: C1 is a convergent node and G1 its convergence point, so that if, as is the case in FIG. 1, on a path from C1 to G1, there is a convergent node D2, then its convergence point F2 is located in front of G1 on the path. The groups of paths passing out of the convergent node are also called a branch (e.g. branch C1->D1 and branch C1->D2).

3) All the paths produced from the root finish either by a terminator node, or by a convergent node without a convergence point (in this case, all the paths produced from the convergent node finish with a terminator).

4) Each exiting arc from the divergent node or a convergent node, constitutes a structure known as a branch and which represents the group of paths produced. The suppression of such an arc leads to the destruction of all the paths.

The different nodes introduced are the basis for structures interleaved in one another. A distinction can be made between mother structures, daughter structures and sister structures. A mother structure is a structure including or covering another structure. A daughter structure is a structure included in or covered by another structure. Sister structures are structures of the same level.

For example, a branch passing out of the divergent node is a daughter structure of the divergent node and the mother structure of nodes belonging to the group of paths produced. Two branches passing out of a convergent node are sister structures.

In FIG. 1, A is the divergent node and constitutes a mother structure. B1, D1, E1, F1, G1, C2, C4, E2, E3 and F2 are simple nodes and among these G1 and F2 are convergence points. H1, D3, B3 and C3 are terminator nodes, among which D3 is a convergence point. C1, D2 and B2 are convergent nodes producing three convergence subgraphs (C1, D1, E1, F1, D2, E2, E3, F2), (D2, E2, E3), (B2, C2, C3, C4). The branches A->B1, A->B2 and A->B3 are sister structures. The branches C1->D1 and C1->D2 are sister structures.

FIG. 2 corresponds to the graphic representation on the screen of the graph of FIG. 1 according to the invention. The structured oriented graph is shown in matrix form corresponding to a subdivision of the screen obtained by subdividing said screen into regular rectangular areas. The nodes of the graph are centred in a base rectangle. The arcs are shown vertically, horizontally or both at once.

Hereinafter a definition will be given of a few terms used for producing a structured oriented graph. It makes use of two graphic composition types, namely horizontal arrangements and vertical arrangements.

The arrangements:

The horizontal arrangements correspond to the branches leaving the divergent node or a convergent node (juxtaposed rectangles). The vertical arrangements correspond to nodes appearing on a branch (superimposed rectangles).

The size of the nodes and the branches:

A node is shown in a rectangular area formed from basic blocks. This area is defined by its row and column coordinates, by its x-node width and by its y-node height. A single node or a terminator node always has for its dimension x-node-1 and y-node=1. The divergent node has for its dimension the size of the graph.

In the example of FIG. 2, row (A)=1, column (A)=1, x-node (A)=7 and y-node (A)=8.

A convergent node has for its dimension the size of the convergence subgraph. In our example, row (C1)=3, column (C1)=1, x-node (C1)=3 and y-node (C1)=4. A branch is also represented in a rectangular area formed from basic blocks. This area is defined by its row and column coordinates, by its x-branch width and by its y-branch height. In our example, row (A->B2)=1, column (A->B2)=4, x-branch (A->B2)=3 and y-branch (A->B2)=3.

The arcs:

The aforementioned graphic representation produces four arc shapes. The term horizontal arrow is used for an arc leaving the divergent node or a convergent node. These arcs are characterized by:

their coordinates:
arrival column: "column"
arrival row: "row"
their length: "x-size".

In the preceding example, the horizontal arrow A>B1 has as its coordinates column=1; row=2; and for its length x-size=0. The horizontal arrow D2>E3 has for its coordinates column=3; row=5 and for its length x-size=1. The horizontal arrow A>B3 has for its coordinates column=7, row=2 and x-size=3.

The term normal arrow is used for the graphic representation of an arc exiting a simple node and entering a simple node or a terminator node other than a convergence point. These arcs are characterized by:

their coordinates:
arrival column: "column"
arrival row: "row".

For example, the normal arrow E1>F1 has as its coordinates column=1; row=6.

The graphic representation of entering arcs on a convergence point is fragmented according to paths leading to the convergence point. Thus, in the preceding example, the arc from E3 to F2 will only be graphically represented by the vertical-horizontal line from E3 to the arrow E2>F2, because the arrow already appears in the arc E2>F2. It is therefore necessary to define two notions:

the small arrow notion representing the entering arrow on a convergence point and the link notion, which is a line representing an arc portion, a link being associated with a path.

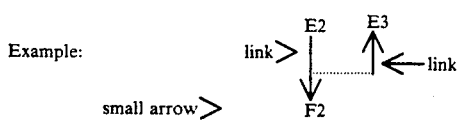

Example:

A small arrow is characterized by:
its coordinates:

arrival column: "column"
arrival row: "row".
A link is characterized by:
its coordinates:
departing column: "column"
departing row: "row"
its extent:
its height: "y-size"
its width: "x-size".

A distinction is made between two types of links, namely horizontal links and vertical-horizontal links. A vertical-horizontal link is associated with paths which do not finish with a terminator node.

In the preceding example, the arc C2>D3 is formed from a vertical-horizontal link and a small arrow. The small arrow has as coordinates: column=4, row=4. The link has as coordinates: column=4; row=3 and for its extent x-size=0 and y-size=0. The characteristics of the link associated with C4 are: column=6, row=3, x-size=1 and y-size=0.

A horizontal link is associated with a path proving the three following conditions:
this path is not the first,
this path finishes by a terminator,
there is a path to the right which does not finish with a terminator.

In the preceding example the horizontal link C3>D3 has as coordinates: column=5; row=3 and for its extent x-size=1 and y-size=0.

The following points should be noted for each convergent node. If all the paths finish by a terminator node, there is no small arrow. In the opposite case, there is one, and only one small arrow formed as soon as a path does not finish by a terminator.

According to the invention, the process makes it possible to minimize redrawing in the case of modifications. The process described hereinafter makes it possible to calculate those parts of the graph affected by a modification, i.e. according to the invention those parts which are to be displaced.

As will be shown hereinafter, despite the complexity of the interleaving of the structures and particularly the convergence subgraphs, the process makes it possible to only locally modify the graph. Two types of modification are distinguished, namely destruction and insertion.

Any modification has repercussions on the including or covering structure, i.e. that containing the element to be destroyed or that containing the reference element with respect to which the insertion takes place. These modifications can have repercussions at the higher level. The incremental decompilation process carries out modifications in a gradual manner, i.e. between individual covering structures, up to the non-evolution of certain parameters (defined hereinafter) and at the most up to the divergent node.

The decompilation process will now be described relative to its main stages and then in a detailed manner on the basis of examples.

This process can be used for any computer type with which an attempt is made to produce and modify a structured oriented graph more particularly used by the description and specification language DSL. The process consists of defining a data structure, which describes any state graph in the form of a tree structure (FIG. 1).

This structure is stored in a memory of a not shown computer or microcomputer. It consists of the internal representation of the graph. The process then consists of drawing up a correspondence between said tree structure and an external representation. The latter is the image of the tree obtained on the microcomputer screen.

A one-to-one correspondence table is consequently stored. In the case of DSL, said table contains the different nodes (start, stop, state, task, decision) corresponding to the nodes of the tree, the links and their location defined with respect to a matrix subdivision of the screen. Each DSL state (tree divergent node) is centred in a block of the screen. The latter results from a subdivision into regular areas (e.g. rectangular areas). The arcs are shown vertically and/or horizontally and belong to a screen row or column.

The table of correspondence also incorporates the complete identification of the elements. This identification takes place by a description concerning the nature of the element, the column, the row, the horizontal and vertical sizes, the type and size of the arrows, the link if it is a decision branch (convergent node). A link is described by its coordinates (starting column and row), as well as by its extent in the vertical and horizontal directions (width and height).

The effective production of a graph is obtained by successive insertion and/or destruction operations relative to the elements chosen by the user. These insertion or destruction operations are carried out by producing position shifts for the existing elements located beyond the element to be destroyed or inserted.

I. DESTRUCTION OPERATION

To carry out this operation, the operator has an input/output peripheral, e.g. a mouse and by checking on the screen makes the choice of the operation (destruction) and the element to be destroyed. The process then takes place in the following way:
determining the covering or including structure of the element to be destroyed,
determining the shifts to be made from right to left and bottom to top,
updating the internal structure.

The determination of the covering structure consists of determining the branch structure containing the branch or node to be destroyed and its mother structure.

The operations of determining the covering structure and the determination of the shifts are iterative and stop when the displacements to be made are zero and at the latest on rising to the root of the tree (i.e. up to the divergent node).

Therefore the destruction of an element of the graph consists of carrying out stages of displacement from right to left (called left displacements or horizontal displacements) and stages of displacements from bottom to top (called top displacements or vertical displacements).

A) Description of the Operation of Destroying an Element

On considering the example given in FIG. 3, the destruction of the branch G3>H3 will lead, in a first stage, to a left displacement of the brach G3>H4. In a second stage, these modifications lead to a top displacement of the node J1, because the two remaining branches G3>H2 and G3>H4 have a length below that of the destroyed branch. In a third stage, there is a left displacement of the branch E3>F3 and a top displacement of the node K1. Finally, in a last stage, there is a top displacement of the node L1 and no left displacement of the branch A>B3 (due to the width of the convergent node C2). The final result is given in FIG. 5. The different stages of the calculation shown in FIG. 4 will be described hereinafter.

For each stage consideration is given to the two structures, namely a branch structure and its mother structure (convergent node or divergent node containing the branch). Initially, the branch structure is that which contains the node to be destroyed, or the branch itself in the case of the destruction of a branch.

In the following stage, the branch structure is the branch on which is located the mother structure of the preceding stage and which becomes the daughter structure. The stopping of the modifications takes place when the horizontal and vertical displacements are zero, or when the mother structure is the divergent node.

In the example of FIG. 3, there are the following four stages:

First stage: The branch structure is the branch G3>H3 and the mother structure is the convergent node G3.

Second stage: The branch structure is the branch F2>G3 and the mother structure is the convergent node F2.

Third stage: The branch structure is the branch E3>F2 and the mother structure is the convergent node E3.

Fourth stage: The branch structure is the branch A>B2 and the mother structure is the divergent node A.

In each stage, the modifications take place as a function of the modifications in the preceding stage. For each stage, calculation takes place of the value of the displacements to be made (horizontal and vertical displacements) and the value of the two rectangular regions to be displaced (a right region and a bottom region). The horizontal displacement acts on the right region and the vertical displacement on the bottom region.

The right and bottom regions are defined by their coordinates (column and row of the block at the top and left of the region), their height and width.

When the horizontal displacement is zero, the right region is not calculated. When the vertical displacement is zero, the bottom region is not calculated.

The horizontal displacement is called x-displ. and the vertical displacement y-displ.

The value of the initial displacements and of the initial bottom region is dependent on the type of destruction:

1. In the case of the destruction of a branch:
initial x-displ = −x-branch (branch structure)
initial y-displ = −y-branch (branch structure)
initial bottom region:
row = row (branch structure) + y-branch (branch structure)
column = column (branch structure)
width = x-branch (branch structure)
height = y-node (mother structure) − y-branch (branch structure) − 1.

2. In the case of the destruction of a node:
initial x-displ = min (0, max (x-node, branch structure node and ≠ node to be destroyed)
x-branch (branch structure)

initial y-displ = −y-node
initial bottom region:
row = row (node) + y-node (node)
column = column (branch structure)
width = x-branch (branch structure)
height = y-node (mother structure) − Σ(y-node, branch structure enode and from the following node the modified node) − 1.

For the following stages, no matter what the destruction type and also on initialization with regards to the right region:
y-displ = = min (0, max y-branch, ebranch (mother structure)
y-node (mother structure) + 1
x-displ = min (0, max x-node, branch structure enode
x-branch (branch structure)
right region:
row = row (mother structure)
column = column (branch structure) + x-branch (branch structure)
width: if there is a branch to the right of the branch structure then column (mother structure) + x-node (mother structure) − column (right branch)
if not 0
height = y-node (mother structure)
bottom region:
row = row (daughter structure) + y-node (daughter structure) − y-displ
column = column (branch structure)
width = x-branch (branch structure)
height = y-node, node (branch structure and node following the daughter structure).

The processing of the arrows consists of modifying:
the column coordinate of all the branches to the right of the branch structure if there is one: for any right branch bi
column (bi) = column (bi) + x-displ
the x-size of the horizontal arrow of the branch immediately to the right of the branch structure.

In the case of the destruction of a branch and only in the first stage:
x-size (branch to right) = x-size (branch structure).

In all other cases:
x-size (branch to right) = x-size
(branch to right) + x-displ.

The processing of links: this case relates to convergent nodes. The analysis of the node takes place through all its branches (bi) and from right to left (bi, i = 1 to n, 1 representing the branch furthest to the right). The links are calculated in each stage.

Three different cases can occur:
The branch bi has no link:
the final node of the branch bi is a terminator and there are no links to the right (all the branches to the right of bi finish with a terminator node). In this case, no information is calculated.
The branch bi has a horizontal link:
the final node of the branch bi is a terminator and there is at least one link to the right (at least one of the branches to the right of bi not finishing with a terminator). In this case it is necessary to calculate the starting coordinates of the link and its extent y-size (bi) in a horizontal link is always = 0.

Column = column (bi)
row = row (mother structure) = y-node (mother structure) − 1 x-size=x-branch (left branch (bi+1))
if there is a left branch, if not 0
y-branch=0
the branch bi has a vertical-horizontal link:
the final node of the branch bi is not a terminator. In this case it is necessary to calculate the starting coordinates of the link and its extent:
column=column (bi)
row=row (bi)+y-branch (bi)
x-size=x-branch (branch to left (bi+1)) if there is a left branch, if not 0
y-size=y-node (mother structure)−y-branch (bi)−1.

B) More Detailed Description of the Different Stages of the Process in the Case of a Destruction Operation 1. The process firstly comprises an initialization stages consisting of:
a) determining the initial branch structure and its mother structure,
b) calculating the initial displacements: horizontal displacement (x-displ) and vertical displacement (y-displ),
c) calculating the initial right region and the initial bottom region.

2. The process then has the following iterative stages:
a) processing of the arrows
b) updating the branch structure
x-branch (branch structure=x-branch (branch structure)+x-displ
y-branch (branch structure)=y-branch (branch structure)+y-displ
c) horizontal displacement of the right region
d) vertical displacement of the bottom region
e) calculating of the new vertical displacement
y-displ=min (0, max (y-branch, mother structure ebranch)−y-node (mother structure)+1
f) updating the mother structure
x-node (mother structure)=x-node (mother structure)+x-displ
y-node (mother structure)=y-node (mother structure)+y-displ
g) processing of links
h) if the mother structure is the divergent node or
if the displacements or all zero
then stop
if not calculate the new branch structure
calculate the daughter structure
calculate the new mother structure
calculate the new horizontal displacement x-displ=min (0, max (x-node, node belonging to the branch structure)−x-branch (branch structure)
calculate the new right region
calculate the new bottom region
return to 2a).

Two examples are subsequently given to illustrate this process, namely an example relating to the destruction of a branch and an example relating to the destruction of a node.

a) Destruction of a branch (FIGS. 3, 4, 5)

FIG. 4 graphically shows the different steps of the process during the updating of the diagram. The regions I are displaced during the first stage, the regions II during the second stage, the regions III during the third stage and the regions IV during the fourth stage.

Initialization:
branch structure=branch G3->H3
mother structure: convergent node G3
x-displ=−x-branch (G3->H3)=−1
y-displ=−y-branch (G3->H3)=−2
initial right region
row=row (G3)=7
column=column (G3->H3)+x-branch (G3->H3)=5+1=6
width=column (G3)+x-node (G3)−column (G3->H4)=4+3−6=1
height=y-node (G3)=3
initial bottom region
row=row (G3−H3)+y-branch (G3->H3)=7+2=9
column=column (G3->H3)=5
width=x-branch (G3->H3)=1
height=y-node (G3)−y-branch (G3->H3)−1=3−2−1=0
Stage 1 (region I, FIG. 4)
processing the arrow (branch G3->H4)
column (G3->H4)=6=1=5
x-size (G3->H4)=x-size (G3->H3)=1
(destruction of a branch, first stage)
updating the branch structure
x-branch (G3->H3)=1−1=0
y-branch (G3->H3)=2−2=0
horizontal displacement of the right region
vertical displacement of the bottom region
calculation of the vertical displacement for modifying the mother structure
y-displ=min (0, max (1,0,1)−3+1)=−1
final size of the mother structure
x-node (G3)=3−1=2
y-node (G3)=3−1=2
processing of the links: displacement to the left has taken place.

Branch (G3->H4).(b1): vertical-horizontal link
column=column (b1)=5
row=row (b1)+y-branch (b1)=7+1=8
x-size=x-branch (G3->H2)=1
y-size=y-node (G3)−y (branch (b1)−1=2−1−1=0
branch (G3->H2).(b2): vertical-horizontal link
column=column (b2)=4
row=row (b2)+y-branch (b2)=7+1=8
x-size=0 (no left branch)
y-size=y-node (G3)−y-branch (b2)−1=2−1−1=0
new branch structure: branch F2->G3 new daughter structure: convergent node G3
new mother structure: convergent node F2
x-displ=min (0, max (2,1)−3)=−1.
right region
row=row (F2)=6
column=column (F2->G3)+x-branch (F2->G3)=4+3=7
width=0, no branch to right of F2-G3
height=y-node (F2)=5
bottom region
row=row (G3)+y-node (G3)+1=7+2+1=10
column=column (F2->G3)=4
width=x-branch (F2->G3)=3
height=y-node (Ji)=1.

Stage 2 (region II, FIG. 4):
processing the arrows: none: no branch to the right of the branch structure
updating the branch structure x-branch=3−1=2
y-branch=4−1=3
horizontal displacement of the right region
vertical displacement of the bottom region
calculating the new vertical displacement for modifying the mother structure
y-displ=min (0, max (1,3)−5+1)=−1
final size of the mother structure
x-node (F2)=4−1=3
y-node (F2)=5−1=4
processing the links: the displacement to the left has taken place
branch (F2->G3).(b1): vertical-horizontal link
column=column (b1)=4
row=row (b1)+y-branch (b1)=6+3=9
x-size=x-branch (F2->G2)=1
y-size=y-node (F2)−y-branch (b1)−1=4−3−1=0
branch (F2)->G2). (b2): vertical-horizontal link
column=column (b2)=3
row=row (b2)+y-branch (b2)=6+1=7
x-size=1 no branch to the left of b2
y-size=y-node (F2)−y-branch (b2)−1=4−1−1=2
new branch structure: branch E3->F2
new daughter structure: convergent node F2
new mother structure=convergent node E3
x-displ=min(0, max (3,1)−4)=−1
right region
row=row (E3)=5
column=column (E3>F2)+x-branch (E3>F2)=3+4=7
width=column (E3)+x-node (E3) column (E3−F3)=3+5−7=1
height=y-node (E3)=7
bottom region
row=row (F2)+y-node (F2)−y-displ=6+4+1=11
column=column (E3>F2)=3
width=x-branch (E3>F2)=4
height=y-node (K1)=1

Stage 3 (region III, FIG. 4)
processing the arrows
column (E3>F3)=7−1=6
x-size (E3>F3)=4−1=3
updating the branch structure
x-branch=4−1=3
y-branch=6−1=5
horizontal displacement of the right region
vertical displacement of the bottom region
new vertical displacement for modifying the mother structure
y-displ=min (0, max (5,1)−7+1)=−1
final size of the mother structure
x-node (E3)=5−1=4
y-node (E3)=7−1=6
processing the links: the displacement to the left has taken place:
branch (E3>F3)•(b1): vertical-horizontal link
column=column (b1)=6
row=row (b1)+y-branch (b1)=5+1=6
x-size=x-branch (E3>F2)=3
y-size=y-node (E3)−y-branch (E3>F3)−1=6−1−1=4
branch (E3>F2)•(b2): vertical-horizontal link
column=column (b2)=3
row=row (b2)+y-branch (b2)=5+5=10
x-size=0 (no branch to the left)
y-size=y-node (E3)−y-branch (E3>F2)−1=6−5−1=0 new branch structure: branch A>B2
new daughter structure: convergent node E3
new mother structure: divergent node A
x-displ=min (0, max (1,5,4,1)−5=0
right region
not calculated because x-displ=0
bottom region
row=row (E3)+y-node (E3)+y-displ=5+6+1=12
column=column (A>B2)=3
width=x-branch (A>B2)=5
height=y-node (L1)=1

Stage 4 (region IV, FIG. 4):
processing the arrow: none because x-displ=0
updating the branch structure
x-branch=5+0=5
y-branch=11−1=10
vertical displacement of the bottom region
new vertical displacement for modifying the mother structure
x-node (A)=9+0=9
y-node (A)=12−1=11
processing the links
none: the mother structure is the divergent node
stop because the mother structure is the divergent node.

b) Destruction of a node (cf. FIGS. 6, 7 and 8)

FIG. 6 shows the node to be destroyed H3, FIG. 7 gives the different steps for updating the diagrams and FIG. 8 gives the results obtained. Region I is displaced during the first stage, region II during the second stage, region III during the third stage and region IV during the fourth stage.

Destruction of the Node H3 (FIGS. 6, 7, 8).

Initialization
branch structure=branch G3>H3
mother structure=convergent node G3
initial displacements
x-displ=min (0, max (1−1)=0
y-displ=−1
right region
not calculated because x-displ=0
bottom region
row=row (H3)+y-node (H3)=8+1=9
column=column (G3>H3)=5
width=x-branch (G3>H3)=1
height=3−(1)−1=1

Stage 1 (region I, FIG. 7):
no processing of arrows, because x-displ=0
updating the branch structure
x-branch=1+0=1
y-branch=2−1=1
vertical displacement of the bottom region
calculation of the new vertical displacement for modifying the mother structure
y-displ=min (0, max (1,1,1)−3+1)=−1
final size of the mother structure
x-node (G3)=3+0=3
y-node (G3)=3−1=2
processing the links
branch (G3>H4)•(b1): vertical-horizontal link
column=column (b1)=6
row=row (b1)+y-branch (b1)=7+1=8
x-size=x-branch (G3>H3)=1
y-size=y-node (G3)−y-branch (b1)−1=2−1−1=0 branch (G3>H3)●(b2): horizontal link
column=column (b2)=5
row=row (G3)+y-node (G3)−1=7+2−1=8
x-size=x-branch (G3>H2)=1
y-size=0
branch (G3>H2)●(b3): vertical-horizontal link
column=column (b3)=4
row=row (b3)+y-branch (b3)=7+1=8
x-size=0 (no branch to the left)
y-size=y-node (G3)−y-branch (b3)−1=2−1−1=0
new branch structure=branch F2>G3
new daughter structure=convergent node G3
new mother structure=convergent node F2
x-displ=min (0, max (3,1)−3)=0
right region
not calculated, because x-displ=0
bottom region
row=row (G3)+y-node (G3)−y-displ=7+2+1=10
column=column (F2>G3)=4
width=x-branch (F2>G3)=3
height=y-node (J1)=1

Stage 2 (region II, FIG. 7):
processing the arrows: none because x-displ=0
updating the branch structure
x-branch=3+0=3
y-branch=4−1=3
vertical displacement of the bottom region
new vertical displacement for updating the mother structure
y-displ=min (0, max (1,3)−5+1)=−1
final size of the mother structure
x-node=4+1=4
y-node=5−1=4
processing the links
branch (F2>G3)●(b1): vertical-horizontal link
column=column (b1)=4
row=row (b1)+y-branch (b1)=6+3=9
x-size=x-branch (F2>G2)=1
y-size=y-node (F2)−y-branch (b1)−1=4−3−1=0
branch (F2>G2)●(b2): vertical-horizontal link
column=column (b2)=3
row=row (b2)+y-branch (b2)=6+1=7
x-size=0 (no left branch)
y-size=y-node (F2)−y-branch (b2)−1=4−1−1=2
new branch structure=branch E3>F2
new daughter structure=convergent node F2
new mother structure=convergent node E3
x-displ=min (0, max (4,1)−4)=0
right region
not calculated because x-displ=0
bottom region
row=row (F2)+y-node (F2)−y-displ=6+4+1=11
column=column (E3>F2)=3
width=x-branch (E3>F2)=4
height=y-node (K1)=1

Stage 3 (region III, FIG. 7):
processing the arrows: none because x-displ=0
updating the branch structure
x-branch=4+0=4
y-branch=6−1=5
vertical displacement of the bottom region
calculation of the new vertical displacement for updating the mother structure
y-displ=min (0, max (5,1)−7+1)=−1
final size of the mother structure
x-node (E3)=5+0=5
y-node (E3)=7−1=6
processing the links
branch (E3>F3)●(b1): vertical-horizontal link
column=column (b1)=7
row=row (b1)+y-branch (b1)=5+1=6
x-size=x-branch (E3>F2)=4
y-size=y-node (E3)−y-branch (b1)−1=6−1−1=4
branch (E3>F2)●(b2): vertical-horizontal link
column=column (b2)=3
row=row (b2)+y-branch (b2)=5+5=10
x-size=0 (no branch to left)
y-size=y-node (E3)+y-branch (b2)−1=6−5−1=0
new branch structure=branch A>B2
new daughter structure=convergent node E3
new mother structure=divergent node A
x-displ=min (0, max (1,5,5,1)−5)=0
right region
not calculated because x-displ=0
bottom region
row=row (E3+y-node (E3)−y-displ=5+6+1=12
column−column (A>B2)=3
width=x-branch (A>B2)=5
height=y-node (L)=1

Stage 4 (region IV, FIG. 7)
processing the arrows: none because x-displ=0
updating the branch structure
x-branch=5+0=5
y-branch=11−1=10
vertical displacement of the bottom region
new vertical displacement
y-displ=min (0, max (7,10,8)−12+1)=−1
final size of the mother structure
x-node (A)−9+0=9
y-node (A)=12−1=11
processing the links
none because the mother structure is the divergent node
stop because the mother structure is the divergent node.

II. INSERTION OPERATION

Insertion consists of the stagewise performance of left to right displacements (also called right displacements or horizontal displacements) and top to bottom displacements (also called bottom displacements or vertical displacements).

In the case of destruction, the first stage is to modify the structure covering the element to be destroyed, followed by modifications and displacements between individual covering structures until the displacements become zero or at the most to the root.

For insertion, displacements take place in the opposite direction. Displacements of the covering structure at the highest level affected by the modification take place and extend to the structure which will contain the element to be inserted.

Therefore the insertion operation has two separate phases. The first phase consists of calculating the displacements and regions to be displaced and calculating the modifications of the branch structures and mother structures. Once the highest level covering structure has been determined, the second phase consists of dropping again into the structures and then carrying out displacements, followed by insertion.

FIG. 9 shows a diagram in which insertion takes place of a branch E3->ZO. Two structures are determined in each stage, namely a branch structure and its mother structure (convergent node or divergent node containing the branch).

Initially, the branch structure is that containing the node to be inserted or the empty bi branch (x-branch=0, y-branch=0) in the case of inserting a branch positioned at the location where the branch will be inserted.

In the following stage (row ≠0 and column ≠0), the branch structure is the branch on which is located the mother structure of the preceding stage, which then becomes the daughter structure. "Redescent" takes place when the horizontal and vertical displacements are zero or when the divergent node is reached.

A) Description of an Element Insertion Operation

There are the following two stages in FIG. 9:
First stage: the branch structure is the branch E3->ZO and the mother structure the convergent node E3.

Second stage: the branch structure is the branch A->B2 and the mother structure the divergent node A, the daughter structure being the convergent node E3.

Outwards, for each stage, calculation takes place of the value of the displacements to be carried out (horizontal and vertical displacements) and the regions to be displaced and the sizes of the branch and mother structures are modified. On the return, in each stage, displacements are carried out, followed by insertion. The value of the initial displacements and the initial bottom region is dependent on the type of insertion.

1. In the case of the insertion of a branch:
initial x-displ=x-branch (branch to be inserted)
initial y-displ=y-branch (branch to be inserted)
initial bottom region=empty region.

2. In the case of the insertion of a node:
initial x-displ=max (0, x-node (node to be inserted)−x-branch (branch structure)
initial y-displ=y-node (node to be inserted)
initial bottom region
row=row (node to be inserted)
column=column (branch structure)
width=x-branch (branch structure)
height=Σ(y-node, node belonging to the branch structure and following the node to be inserted).

In the following stages, no matter what the type of insertion and also on initialization with regards to the right region:
y-displ=max (0, y-branch (branch structure)−y-node (mother structure)+1)
x-displ=max (0, x-node (daughter structure)−x-branch (branch structure)
right region
row=row (mother structure)
column=column (branch structure)+x-branch (branch structure)
width if there is a branch to the right of the branch structure then
column (mother structure)+x-node (mother structure)−column (right branch)
if not 0
height=y-node (mother structure)
bottom region
row=row (daughter structure)+y-node (daughter structure)−y-displ
column=column (branch structure)
width=x-branch (branch structure)
height=Σ(y-node, branch structure ε node and node following the daughter structure).

The processing of the arrows consists of modifying the column coordinate of all the branches to the right of the branch structure if there is one and for any branch to the right bi:
column (bi)=column (bi)+x-displ
the x-size of the horizontal arrow of the branch immediately to the right of the branch structure.

In the case of the insertion of a branch and only in the first stage:
x-size (right branch)=x-size (branch to be inserted)
in all other cases:
x-size (right branch)=x-size (right branch)+x-displ.

Processing of the links: This case relates to convergent nodes. The analysis of the node takes place through all the branches (bi) and from right to left. The links are calculated in each stage:
branches Bi (bi, i=1 to n, 1 representing the branch furthest to the right):
Three different cases can be encountered:
the branch bi does not have a link:
the final node of the branch bi is a terminator and there is no right link (all the branches bi finish with a terminator node).

In this case, no information is calculated.
The branch bi has a horizontal link:
The final node of the branch bi is a terminator and there is at least one right link (at least one of the branches to the right of bi does not finish by a terminator). In this case, it is necessary to calculate the starting coordinates of the link and its extent:
y-size (b) in a horizontal link is always=0:
column=column (bi)
row=row (mother structure)+y-node (mother structure)−1)
x-size=x-branch (left branch (bi+1)),
if there is a left branch if not 0
y-size=0
the branch bi has a vertical-horizontal link:
the final node of the branch bi is not a terminator. In this case, it is necessary to calculate the starting coordinates of the link and its extent:
column=column (bi)
row=row (bi)+y-branch (bi)
x-size=x-branch (left branch (bi+1))
if there is a left branch, if not 0
y-size=y-node (mother structure)−y-branch (bi)−1.

B) More Detailed Description of the Different Stages of the Process in the Case of an Insertion 1. The process firstly has an initialization stage consisting of:
a) determining the initial branch structure and its mother structure
b) calculating the initial displacements:
horizontal displacement (x-displ) and vertical displacement (y-displ)
c) calculating the initial right region and the initial bottom region.

2. Then the process involves the following iterative stages:
a) processing the arrows
b) updating the branch structure
x-branch (branch structure)=x-branch (branch structure)+x-displ
y-branch (branch structure)=y-branch (branch structure)+y-displ
c) calculating the new vertical displacement
y-displ=max (0, y-branch (branch structure)−y-node (mother structure)+1)
d) updating the mother structure x-node (mother structure)=x-node (mother structure)+x-displ
y-node (mother structure)=y-node (mother structure)+y-displ
e) processing the links
f) if the mother structure is the divergent node or if the displacements are both zero, then horizontal displacement of the right regions and vertical displacements of the bottom regions from the final mother structure to the first (i.e. that containing the structure to be inserted), followed by the insertion of the structure, if not calculation of the new branch structure
calculation of the daughter structure
calculation of the new mother structure
new horizontal displacement
x-displ=max (0, x-node (daughter structure)=x-branch (branch structure)
calculation of the new right region
calculation of the new bottom region
return to 2a).

a) Case of Inserting a Branch (FIGS. 9, 10 and 11)
Initialization
branch structure=empty branch positioned at row=5 and column=7
(x-branch=0, y-branch=0)
mother structure=convergent node E3
x-displ=x-branch (E3->ZO)=1
y-displ=y-branch (E3->ZO)=1
initial right region
row=row (E3)=5
column=column (branch structure)=7
width=column (E3)+x-node (E3)−column (E3->F3)=3+5−7=1
height=y-node (E3)=7
initial bottom region=empty region Stage 1 (region I, FIG. 10)
processing the arrows
column (E3->F3)=7+1=8
x-size (E3->F3)=1
updating the branch structure
x-branch=0+1=1
y-branch=0+1=1
new vertical displacement
y-displ=max (0, y-branch (E3->ZO)−y-node (E3)+1=max (0,1−7+1)=0
updating the mother structure
x-node (E3)=5+1=6
y-node (E3)=7+0=7
processing the links
branch (E3->F3).(bi): vertical-horizontal link
column=column (E3->F3)=8
row=row (b1)+y-branch (b1)=5+1=6
x-size=x-branch (E3->ZO)=1
y-size=y-node (E3)−y-branch (E3->F3)−1=7−1−1=5
branch (E3->ZO).(b2): vertical-horizontal link
column=column (E3->ZO)=7
row=row (b2)+y-branch (b2)=5+1=6
x-size=x-branch (E3->F2)=4
y-size=y-node (E3)−y-branch (E3->ZO)−1=7−1−1=5
branch (E3->F2).(b3): vertical-horizontal link
column=column (E3->F2)=3
row=row (b3)+y-branch (b3)=5+6=11
x-size=0
y-size=y-node (E3)−y-branch (b3)−1=7−6−1=0 new branch structure=branch (A->B2)
new mother structure-divergent node (A)
daughter structure=convergent node (E3)
new horizontal displacement
x-displ=max (0, x-node (E3)−x-branch (A->B2))=max (0,6−5)=1
new right region
row=row (A)
column=column (A-B2)+x-branch (A->B2)=3+5=85
width=column (A)+x-node (A)−column (A->B3)=1+9−8=2
height=y-node (A)=12
new bottom region (not calculated because y-displ=0).

Stage 2 (region II, FIG. 10)
processing the arrows
column (A->B3)=column (A->B3)+1=8+1=9
x-size (A->B3)=x-size (A->B3)+1=5+1=6
updating the branch structure
x-branch (A->B2)=5+1=6
y-branch (A->B2)=11+0=11
new vertical displacement
y-displ=max (0, y-branch (A->B2)−y-node (A)+1)=0
updating the mother structure
x-branch (A)=9+1=10
y-branch (A)=12+0=12
processing the links: none because the mother structure is the divergent node.
As the mother structure is the divergent node, displacement of the regions II, and then I respectively according to the displacements calculated in stages II and then I and insertion of the branch E3->ZO.

b) Case of Inserting a Node (FIGS. 12, 13 and 14)
Initialization
branch structure=branch (G3-H3)
mother structure=convergent node (G3)
x-displ=max (0, x-node (ZO)−x-branch (G3->H3))=max (0, 2−1)=1
y-displ=y-node (ZO)=2
initial right region
row=row (G3)=7
column=column (G3->H3)+x-branch (G3->H3)=5+1=6
width=column (G3)+x-node (G3)−column (G3->H4)=4+3−6=1
height=y-node (G3)=3
initial bottom region
row=row (ZO)=9
column=column (G3->H3)=5
width−x-branch (G3->H3)=1
height=y-node (I1)=1

Stage 1 (region I, FIG. 13)
processing the arrows
column (G3->H4)=6+1=7
x-size (G3->H4)=x-size (G3->H4)+x-displ=1+1=2
updating the branch structure
x-branch (G3->H3)=1+1=2
y-branch (G3->H3)=2+2=4
new vertical displacement
y-displ=max (0, y-branch (G3->H3)−y-node (G3)+1)=max (0, 4−3+1)=2
updating the mother structure
x-node (G3)=3+1=4
y-node (G3)=3+2=5 processing the links
branch (G3->H4).(b1): vertical-horizontal link
column=column (b1)=7
row=row (b1)+y-branch (b1)=7+1=8
x-size (G3->H4)=x-branch (G3->H3)=2
y-size (G3->H4)=y-node (G3)−y-branch (b1)−1=5−1−1=3
branch (G3->H3)−(b2): vertical-horizontal link
column=column (b2)=5
row=row (b2)+y-branch (b2)=7+4=11
x-size (G3->H3)=x-branch (G3−H2)=1
y-size (G3->H3)=y-node (G3)−y-branch (b2)−1=5−4−1=0
branch (G3->H2).(b3): vertical-horizontal link
column=column (b3)=4
row=row (b3)+y-branch (b3)=7+1=8
x-size (G3->H2)=0 (no branch to left)
y-size (G3->H3)=y-node (G3)−y-branch (b3)−1=5−1−1=3
new branch structure=branch (F2->G3)
new mother structure=convergent node F2
daughter structure=convergent node G3
new horizontal displacement
x-displ=max (0, x-node (G3)−x-branch (F2->G3))=max (0, 4−3)=1
new right region
row=row (F2)=6
column=column (F2->G3)+x-branch (F2->G3)=4+3=7
width=0 (no right branch)
height=y-node (F2)=5
new bottom region
row=row (G3)+y-node (G3)−2=7+5−2=10
column=column (F2->G3)=4
width=x-branch (F2->G3)=3
height=y-node (J1)=1

Stage 2 (region II, FIG. 13)
processing the arrows
no branch to the right
updating the branch structure
x-branch (F2->G3)=3+1=4
y-branch (F2->G3)=4+2=6
new vertical displacement
y-displ=max (0, y-branch (F2->G3)−y-node (F2)+1)=max (0, 6−5+1)=2
updating the mother structure
x-node (F2)=4+1=5
y-node (F2)=5+2=7
processing the links
branch (F2->G3).(b1): vertical-horizontal link
column=column (b1)=4
row=row (b1)+y-branch (b1)=6+6=12
x-size (F2->G3)=x-branch (F2->G2)=1
y-size (F2->G3)=y-node (F2)−y-branch (b1)−1=7−6−1=0
branch (F2->G2)−(b2): vertical-horizontal link
column=column (b2)=3
row=row (b2)+y-branch (b2)=6+1=7
x-size (F2->G2)=0 (no left branch)
y-size (F2->G2)=y-node (F2)−y-branch (b2)−1=7−1−1=5
new branch structure-branch (E3->F2)
new daughter structure=convergent node (F2)
new mother structure=convergent node (E3)
new horizontal displacement
x-displ=max (0, x-node (F2)−x-branch (E3->F2))=max (0, 5−4)=1
new right region
row=row (E3)=5
column=column (E3->F2)+x-branch (E3->F2)=3+4=7
width=column (E3)+x-node (E3)−column (E3->F3)=3+5−7=1
height=y-node (E3)=7
new bottom region
row=row (F2)+y-node (F2)−2=6+7−2=11
column=column (E3->F2)=3
width=x-branch (E3->F2)=4
height=y-node (K1)=1

Stage 3 (region III, FIG. 13)
processing the arrows
column (E3->F3)=column (E3->F3)+1=7+1=8
x-size (E3->F3)=x-size (E3->F3)+x-displ=4+1=5
updating the branch structure
x-branch (E3->F2)=4+1=5
y-branch (E3->F2)=6+2=8
new vertical displacement
y-displ=max (0, y-branch (E3->F2)−y-node (E3)+1)=max (0, 8−7+1)=2
updating the mother structure
x-node (E3)−5+1=6
y-node (E3)=7+2=9
processing the links
branch (E3->F3).(b1): vertical-horizontal link
column=column (b1)=8
row=row (b1)+y-branch (b1)=5+1=6
x-size (E3->F3)=x-branch (E3->F2)=5
y-size (E3->F3)=y-node (E3)−y-branch (b1)−1=9−1−1=7
branch (E3->F2).(b2): vertical-horizontal link
column=column (b2)=3
row=row (b2)+y-branch (b2)=5+8=13
x-size (E3->F2)=0 (no left branch)
y-size (E3->F2)−y-node (E3)−y-branch (b2)−1=9−8−1=0
new branch structure=branch (A->B2)
new mother structure=divergent node (A)
new daughter structure-convergent node (E3)
new horizontal displacement
x-displ=max (0, x-node (E3)=x-branch (A->B2))=max (0, 6−5)=1
new right region
row=row (A)=1
column=column (A->B2)+x-branch (A->B2)=3+5=8
width=column (A)+x-node (A)−column (A->B3)=1+9−8=2
height=y-node (A)=12
new bottom region
row=row (E3)+y-node (E3)−2=5+9−2=12
column=column (A->B2)=3
width=x-branch (A->B2)=5
height=y-node (L1)=1

Stage 4 (region IV, FIG. 13)
processing the arrows
column (A->B3)=column (A->B3)=1=8+1=9
x-size (A->B3)=x-size (A->B3)+x-displ=5+1=6
updating the branch structure
x-branch (A->B2)=5+1=6
y-branch (A->B2)=11+2=13
new vertical displacement
y-displ=max (0, y-branch (A->B2)−y-node (A)+1)-
=max (0, 13−12+1)=2 updating the mother structure
x-node (A)=9+1=10
y-node (A)=12+2=14

Processing the links: none, because the mother structure is the divergent node.

Stop the analysis. Displacement of regions IV, then III, then II and then I respectively in accordance with the displacements calculated in stages IV, then III, then II, then I and insertion of the ZO node.

We claim:

1. Decompilation process for producing graphs by means of a computer connected to a display screen, characterized in that it comprises the following stages:
   storing in a memory a plurality of elements describing a graph in a tree structure of a plurality of nodes having a divergent node corresponding to a root of the tree connected to simple, convergent or terminator nodes, the nodes other than the terminator node being connected to other simple, convergent or terminator nodes, so that the nodes form a basis for structures interleaved in one another;
   creating a table of correspondence between the tree structure and a graphic representation of said tree structure on the screen, in which each element of the graph is marked relative to areas of the screen resulting from a matrix subdivision into rows and columns;
   incrementally modifying the graph by carrying out successive desired insertion or destruction operations on desired elements, said insertions or destructions respectively taking place in a desired area of the screen by successive operations of shifting graph elements located beyond an area containing the desired elements;
   displaying the graph during modifications; and
   updating the tree structure in memory and the table of correspondence.

2. Process according to claim 1, characterized in that a destruction operation comprises the following iterative stages:
   determining the covering structure of the element to be destroyed,
   determining the shifts to be successively carried out from right to left for elements between individual covering structures until these shifts are zero or until the divergent node is reached,
   determining the shifts to be successively carried out from bottom to top for the elements of the individual covering structures until the shifts are zero or until the divergent node is reached.

3. Process according to any one of the preceding claims, characterized in that the determination of the covering structure comprises:
   determining the branch structure of the element to be destroyed,
   determining the mother structure of said element.

4. Process according to claim 1, characterized in that the determination of the shifts to be carried out from right to left and bottom to top consists of:
   determining a right region of the element and a bottom region by the coordinates of these regions, the width and the height,
   determining the value of the corresponding displacements to be made x-displ and y-displ.

5. Process according to claim 1, characterized in that the insertion operation comprises the following iterative stages:
   determining the covering structure of the highest level,
   determining the shifts to be successively made from left to right for the elements of the individual covering structures from the highest level covering structure to the structure containing the element to be inserted,
   determining the shifts to be successively carried out from top to bottom for the individual covering structures.

6. Process according to claim 5, characterized in that the determination of the covering structure consists of:
   determining the branch structure containing the element to be inserted,
   determining the mother structure of said element.

7. Process according to either of the claims 5 or 6, characterized in that the determination of the shifts to be carried out from right to left or top to bottom consists of:
   determining a right region of the element and a bottom region by the coordinates of said regions, the width and the height,
   determining the value of the corresponding displacements to be carried out x-displ and y-displ.

* * * * *